United States Patent
Barrick et al.

(10) Patent No.: US 6,779,162 B2
(45) Date of Patent: Aug. 17, 2004

(54) METHOD OF ANALYZING AND FILTERING TIMING RUNS USING COMMON TIMING CHARACTERISTICS

(75) Inventors: Brian David Barrick, Pflugerville, TX (US); Alvan Wing Ng, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 14 days.

(21) Appl. No.: 10/042,101

(22) Filed: Jan. 7, 2002

(65) Prior Publication Data

US 2003/0131328 A1 Jul. 10, 2003

(51) Int. Cl.[7] .............................................. G06F 17/50
(52) U.S. Cl. ............................ 716/6; 375/326; 716/2; 716/5; 716/12
(58) Field of Search ........................ 375/326, 716/2, 716/5, 6, 12, 4, 196; 370/256

(56) References Cited

U.S. PATENT DOCUMENTS

| 4,698,760 | A | | 10/1987 | Lembach et al. |
| 4,916,627 | A | | 4/1990 | Hathaway |
| 6,099,584 | A | * | 8/2000 | Arnold et al. ................. 716/19 |
| 6,405,347 | B1 | * | 6/2002 | McBride ......................... 716/4 |
| 6,563,886 | B1 | * | 5/2003 | Kubo et al. ................. 375/326 |
| 2001/0038612 | A1 | * | 11/2001 | Vaughn et al. .............. 370/256 |

OTHER PUBLICATIONS

Berman, C. Leonard, et al.; *Efficient Techniques for Timing Correction*; IEEE Article; pp. 415–419; CH2868–8/90–0000; (1990).

* cited by examiner

*Primary Examiner*—Thuan Do
(74) *Attorney, Agent, or Firm*—Carr LLP; Robert M. Carwell

(57) ABSTRACT

A method of analyzing timing reports in a microprocessor design for quick identification of all negative timing paths has been provided. Timing paths are first grouped and saved in a list file. A timing analysis program searches the timing report file for timing paths that match those in the list file. Summary reports have been generated for the existing timing paths. If there are new timing paths, summary reports for the new timing paths are generated. The new timing paths go through the same procedure until all negative timing paths are identified.

16 Claims, 2 Drawing Sheets

METHOD OF ANALYZING AND FILTERING TIMING RUNS USING COMMON TIMING CHARACTERISTICS

BACKGROUND OF THE INVENTION

1. Field of the Invention

The invention relates generally to a microprocessor chip design and, more particularly, to analyzing timing reports used in designing a microprocessor chip for identification of all negative timing paths in a minimum amount of time.

2. Description of the Related Art

Today's microprocessor chips contain millions of logic gates with millions of connections. Timing reports are often hundreds of millions of bytes long containing thousands of paths. In general, timing tools generate a report listing all paths within a set of logic specified by a user and sorted by worst negative slack. The reports are then analyzed manually.

Designers sort through each report, picking out critical paths starting from the most negative paths working their way down to zero. When the report is too large and includes multiple units, it is often broken down into smaller reports by units and then handed over to unit owners for manual analysis. To analyze such reports and keep track of timing fixes is a huge task. Because critical paths are not necessarily listed at the top of the reports, and are easily buried in the reports, one cannot be sure that all critical paths are identified, until an entire report is analyzed.

Therefore, there is a need for a method of analyzing timing reports to identify all negative paths quickly and efficiently.

SUMMARY OF THE INVENTION

The present invention is related to a method for analyzing timing runs.

In accordance with one embodiment of the invention, a method is provided for analyzing a timing report. Timing paths that share common characteristics are grouped. A list file containing the timing paths is created. The timing report is searched for timing paths that match the timing paths in the list file. A first summary report on the timing paths in the input list is generated. The first summary report lists the status of the timing paths. It is determined whether there are new timing path(s) not found in the input list.

In accordance with another embodiment of the invention, a computer program product is provided for analyzing a timing report file. The computer program product has a medium with a computer program embodied thereon. Computer program code reads in a list file containing unique timing paths grouped from a plurality of timing paths. Computer program code reads in timing paths stored in the timing report file. Computer program code extracts information from the timing paths. Computer program code compares the information to the timing paths contained in the list file.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
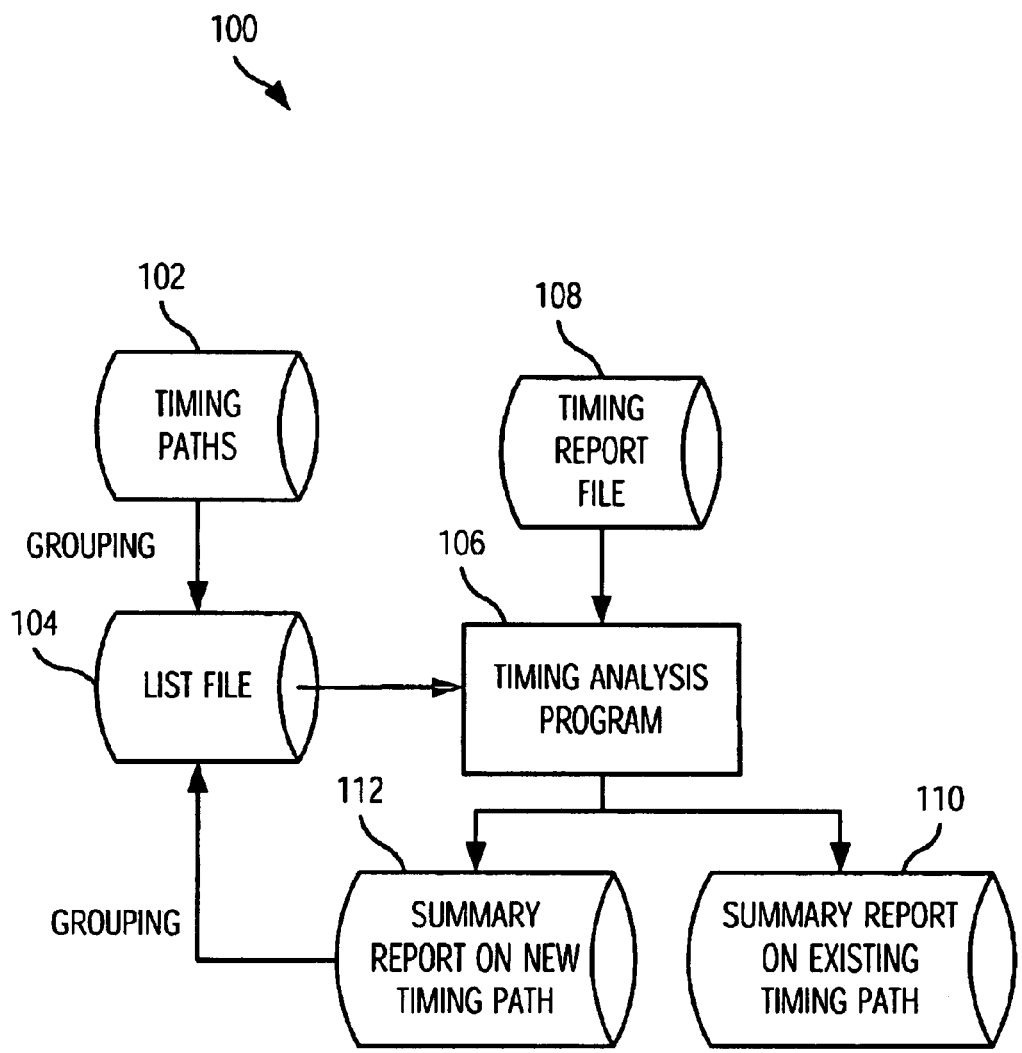
FIG. 1 depicts a high-level block diagram showing timing analysis tools interacting with various data to analyze a timing report in one embodiment of the invention.
Figure 2:
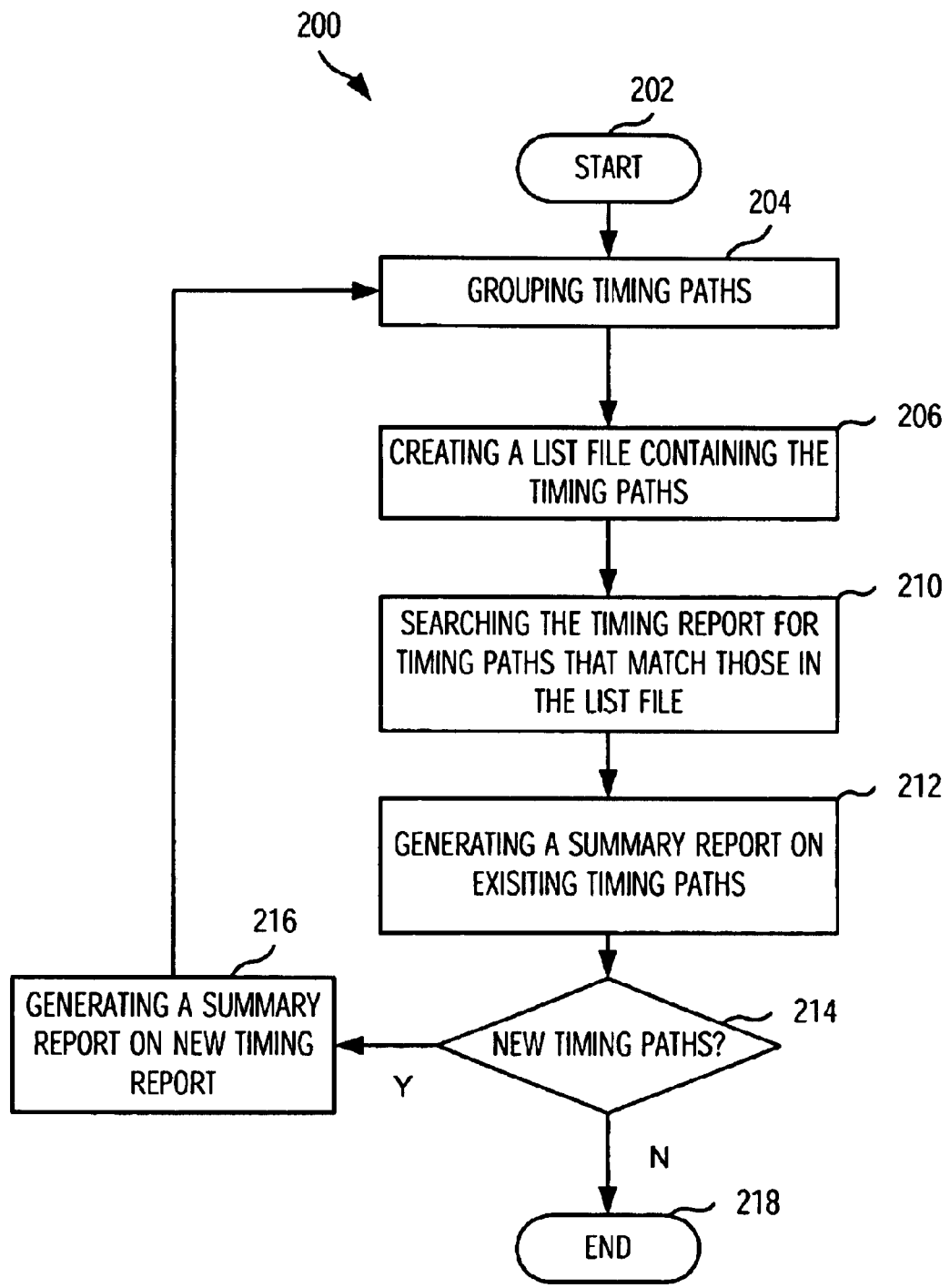
FIG. 2 depicts a flow diagram showing a method of analyzing a timing report in one embodiment of the invention.

The principles of the present invention and their advantages are best understood by referring to the illustrated operations of embodiment depicted in FIGS. 1–2.

Static timing reports are based on source and destination. They report the slowest (or the fastest) path that exists between a source and a destination. A source and destination pair uniquely identify a timing path in a timing run. Timing tools will report violations found in every path. However, not every path represents a unique timing problem. Many failing paths may have a common cause and one simple fix of the common cause can be applied to fix them all.

There are three commonly recognized characteristics of timing paths. First, paths that have the same source share a commonly recognized characteristic. Typical examples include control signals to data paths, such as a load-enable signal to a data bank (latches), a multiplexer-select signal to a data path, and a disable control signal to a group of logic. In these cases, the problem is usually associated with driving either too many loads or too far a distance. The fix must be applied to all such problems in the same way. For example, a wild card such as "*" may be used on a latch bit to identify a load enable path problem on a 128-bit data latch.

Second, a group of signals that travel in the same fashion and in the same direction share a commonly recognized characteristic. Typical examples include data pipes, arrays, and buffers. The problem is usually associated with driving distance and routing. Once again, the fix must be applied to all such problems in the same way. For example, a wild card may be used in the data bit fields to group the problem on a 256-bit bus into 1 unique timing problem.

Third, paths that converge to the same destination share a commonly recognized characteristic. Typical examples include parity bits, error correction coding (ECC), and encoder outputs. These paths are sources from a bus. The problem is usually in a piece of logic that generates the functions. The fix must be applied to all such problems in the same way. For example, a wild card may be used in the data bit fields in the source and in the error bit fields in the destination to group multiple failing paths in the common ECC checking logic into 1 unique timing problem.

Most of the designs today employ wide buses (e.g., 128 bits) for data throughput. Problems in buses area will cause hundreds of paths to be reported. Therefore, the ability to group paths together as one path can greatly reduce the work required to sort through a timing report.

In FIG. 1, a reference numeral 100 designates a block diagram showing a timing paths file 102 containing timing paths. Using the aforementioned commonly-recognized characteristics, the timing paths are grouped and saved in a list file 104, which contains a list of timing paths. The list file 104 is input to a timing analysis program 106, which preferably comprises several analysis tools (not shown) for different functionalities. Generally, the timing analysis program 106 is a collection of scripts, and, preferably, timing analysis program 106 reads in the list file 104 and builds up a path table (not shown). Additionally, the timing analysis program 106 reads in a timing report file 108 containing a timing report, which is parsed to compare each and every path in the timing report file 108 to a matching path in the path table. The timing analysis program 106 outputs summary reports 110 and 112 for existing and new timing paths, respectively. The summary report 110 lists the status of the paths found in the list file 104, whereas the summary report 112 lists the status of the paths not found in the list file 104. These paths are considered new paths and are grouped and added to the list file 104. Thus, the timing analysis program 106 uses these new paths to parse the timing report file 108. This process will be repeated until all negative timing paths are identified.

In one embodiment of the invention, a main routine (not shown) of the timing analysis program 106 parses the timing report file 108 and reads in every timing path in the timing report file 108. The timing path read by the main routine is then passed to a processing routine (not shown). Information, such as a path number, slack, source, and destination, is extracted. The source and destination are then passed to a checking routine (not shown) for path matching, in which they are checked against each path in the path table. Upon a match, the path in the path table is updated with the current slack and path number. There is a hit flag (not shown) associated with each entry in the table. It is very likely that a path described in the table finds multiple matches in the timing report. The table entry is updated only on the very first match to record the worst path with the hit flag set to a logical 1. Subsequent matches only increment the hit flag count to record the number of matches found in the report.

If no match is found in the path table for a timing path in the timing report file 108, the timing path having no match is considered a new timing path. The processing routine will create a new entry in the path table, initialize it with the path information and set its hit flag to a logical 1. Entries created this way, however, contain no wild card and represent a unique path. Because all the new paths will show up, the report can be lengthy and the program may slow down as the table grows. This can post a problem especially at the beginning of building up the initial list. Nevertheless, the new path report provides the summary report 112, which helps glancing for commonality in the paths. Two option switches are provided to stop parsing when a slack range is reached or when a specified number of new paths is collected. A higher level of intelligence can also be implemented in the timing analysis tools software 106 to detect commonality in the paths based on the methods disclosed above.

If a path still exits, its current slack and path number in the timing report file 108 will be reported. If a path cannot be found in the timing report file 108, it will be reported as "Not Found." These paths can be easily filtered out with the "Not Found" key word to review the remaining paths. It is useful to keep those paths that have been fixed in the list file 104 to track the history of a problem. Often, marginal paths may come and go affected by synthesis or layout factors. It is very important to address those hard-to-fix problems early on in the design cycle. They may require a change in architecture and involve difficult design changes. To make matters worse, the critical timing paths are not necessarily the longest paths and can get buried in a report. The value of the invention is to catch all such problems so that designers can make intelligent decisions on real problems.

Now referring to FIG. 2, a flow diagram 200 is shown to illustrate a method of analyzing and filtering timing runs. At step 202, the process begins. At step 204, timing paths contained in the timing paths file 102 are grouped. As mentioned above, timing paths that share certain common characteristics are grouped together and classified as a unique timing path. Preferably, a wild card such as "*" maybe used to group such timing paths to a unique path. The timing paths thus grouped are saved in the list file 104 of FIG. 1 at step 206. At step 210, the timing analysis program 106 of FIG. 1 searches the timing report contained in the timing report file 108 of FIG. 1 for timing paths that match those in the list file 104 of FIG. 1. At step 212, the timing analysis program 106 of FIG. 1 generates the summary report 110 of FIG. 1 listing the status of the timing paths in the list file 104 of FIG. 1. For example, the status of timing paths may include path number, slack, source, and destination. At step 214, it is determined whether one or more new timing paths are discovered at step 210. If so, the timing analysis program 106 of FIG. 1 generates the summary report 112 of FIG. 1 on new timing paths at step 216. After the step 216, new timing paths go through the steps 204, 206, 210, and 212. If no new timing paths are discovered at the step 214, then the process ends at step 218.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A method for analyzing a timing report, the method comprising the steps of:

grouping timing paths, wherein groupings are selected from the characteristics group consisting of shared common source, shared common direction, and shared path convergence;

creating a list file containing the timing paths;

searching a timing report for timing paths that match the timing paths in the list file;

generating a first summary report on the timing paths in the input list, the first summary report listing the status of the timing paths; and determining whether there are new timing path(s) not found in the input list.

2. The method of claim 1, further comprising the steps of:

generating a second summary report on new timing path(s), if there are new timing paths; and repeating the steps until all negative timing paths are identified.

3. The method of claim 1, wherein the step of grouping timing paths that share common characteristics further comprises the step of classifying the timing paths as unique timing paths.

4. The method of claim 1, further comprising the step of:

generating a path table for checking against matching paths in the timing report.

5. The method of claim 1, wherein the status of the timing paths comprise path numbers and slack.

6. A method for analyzing a timing report, the method comprising the steps of:

grouping timing paths that share common characteristics;

creating a list file containing the timing paths;

searching a timing report for timing paths that match the timing paths in the list file;

generating a first summary report on the timing paths in the input list, the first summary report listing the status of the timing paths;

determining whether there are new timing path(s) not found in the input list; and wherein, in the step of grouping timing paths that share common characteristics, wild cards are used to group the timing paths.

7. A computer program product for analyzing a timing report file, the computer program product having a medium with a computer program embodied thereon, the computer program comprising:

computer program code for reading in a list file containing unique timing paths grouped from a plurality of timing paths grouping timing paths, wherein the plurality of timing paths are selected from the characteristics group consisting of shared common source, shared common direction, and shared path convergence;

computer program code for reading in timing paths stored in the timing report file;

computer program code for extracting information from the timing paths; and computer program code for comparing the information to the timing paths contained in the list file.

8. The computer program product of claim 7, wherein the information on extracted from each timing path comprises a path number, slack, source, and destination.

9. The computer program product of claim 7, further comprising computer program code for generating a path table from the timing paths contained in the list file.

10. The computer program product of claim 7, further comprising:

computer program code for generating a path table from the timing paths contained in the list file; and computer program code for updating the path table when a match is found between a timing path in the timing report file and a timing path in the list file.

11. An apparatus for analyzing a timing report, the apparatus comprising:

means for grouping timing paths, wherein groupings are selected from the characteristics group consisting of shared common source, shared common direction, and shared path convergence;

means for creating a list file containing the timing paths;

means for searching the timing report for timing paths that match the timing paths in the list file;

means for generating a first summary report on the timing paths in the input list, the first summary report listing the status of the timing paths; and means for determining whether there are new timing path(s) not found in the input list.

12. The apparatus of claim 11, further comprising:

means for generating a second summary report on new timing path(s), if there are new timing paths.

13. The apparatus of claim 11, wherein the means for grouping timing paths that share common characteristics further comprises means for classifying the timing paths as unique timing paths.

14. The apparatus of claim 11, further comprising:

means for generating a path table for checking against matching paths in the timing report.

15. The apparatus of claim 11, wherein the status of the timing paths comprises path numbers and slack.

16. An apparatus for analyzing a timing report, the apparatus comprising;

means for grouping timing paths that share common characteristics;

means for creating a list file containing the timing paths;

means for searching the timing report for timing paths that match the timing paths in the list file;

means for generating a first summary report on the timing paths in the input list, the first summary report listing the status of the timing paths;

means for determining whether there are new timing path(s) not found in the input list; and wherein the means for grouping timing paths that share common characteristics uses wild cards to group the timing paths.

* * * * *